(12) United States Patent
Chromczak

(10) Patent No.: US 9,048,826 B2
(45) Date of Patent: Jun. 2, 2015

(54) MULTIPLE-VOLTAGE PROGRAMMABLE LOGIC FABRIC

(71) Applicant: ALTERA CORPORATION, San Jose, CA (US)

(72) Inventor: Jeffrey C. Chromczak, Brownsville (CA)

(73) Assignee: Altera Corporation, San Jose, CA (US)

( * ) Notice: Subject to any disclaimer, the term of this patent is extended or adjusted under 35 U.S.C. 154(b) by 82 days.

(21) Appl. No.: 13/917,021

(22) Filed: Jun. 13, 2013

(65) Prior Publication Data

US 2014/0368236 A1     Dec. 18, 2014

(51) Int. Cl.
*H03K 19/0175*       (2006.01)
*H03K 19/173*        (2006.01)
*H03K 19/177*        (2006.01)

(52) U.S. Cl.
CPC ...... *H03K 19/017581* (2013.01); *H03K 19/173* (2013.01); *H03K 19/177* (2013.01)

(58) Field of Classification Search
CPC .................. H03K 19/17736; H03K 19/17728; H03K 19/17704; H03K 19/1733; H01L 23/525; H01L 23/50; H01L 2924/19041; H01L 2924/3011; G06F 17/5054; G06F 17/5045; G06F 17/5072
USPC .......... 326/37–41, 47; 327/564; 716/100–139
See application file for complete search history.

(56) References Cited

U.S. PATENT DOCUMENTS

| | | | | |
|---|---|---|---|---|
| 6,384,628 | B1* | 5/2002 | Lacey et al. | 326/41 |
| 8,595,671 | B2* | 11/2013 | He | 716/116 |
| 8,811,109 | B2* | 8/2014 | Terzioglu et al. | 365/230.06 |
| 2004/0136241 | A1* | 7/2004 | Rapp et al. | 365/189.05 |
| 2012/0112791 | A1 | 5/2012 | Lewis et al. | |

OTHER PUBLICATIONS

Kimiyoshi Usami, et al. "Design of Ultra Low-power MPEG4 Codec Core Exploiting Voltage Scaling Techniques", Jun. 1998, 5 pages, 35th Design Automation Conference, San Francisco, CA.

* cited by examiner

*Primary Examiner* — Dylan White
(74) *Attorney, Agent, or Firm* — Okamoto & Benedicto LLP

(57) ABSTRACT

One embodiment relates to an integrated circuit including a multiple-voltage programmable logic fabric. The programmable logic fabric includes circuits of a first type operating in a first voltage domain and circuits of a second type operating in a second voltage domain. The second voltage domain has a lower supply voltage than the first voltage domain. The integrated circuit further includes downward level conversion circuit elements in the programmable logic fabric for driving signals from the first voltage domain to the second voltage domain and upward level conversion circuit elements in the programmable logic fabric for driving signals from the second voltage domain to the first voltage domain. Other embodiments, aspects, and features are also disclosed.

16 Claims, 9 Drawing Sheets

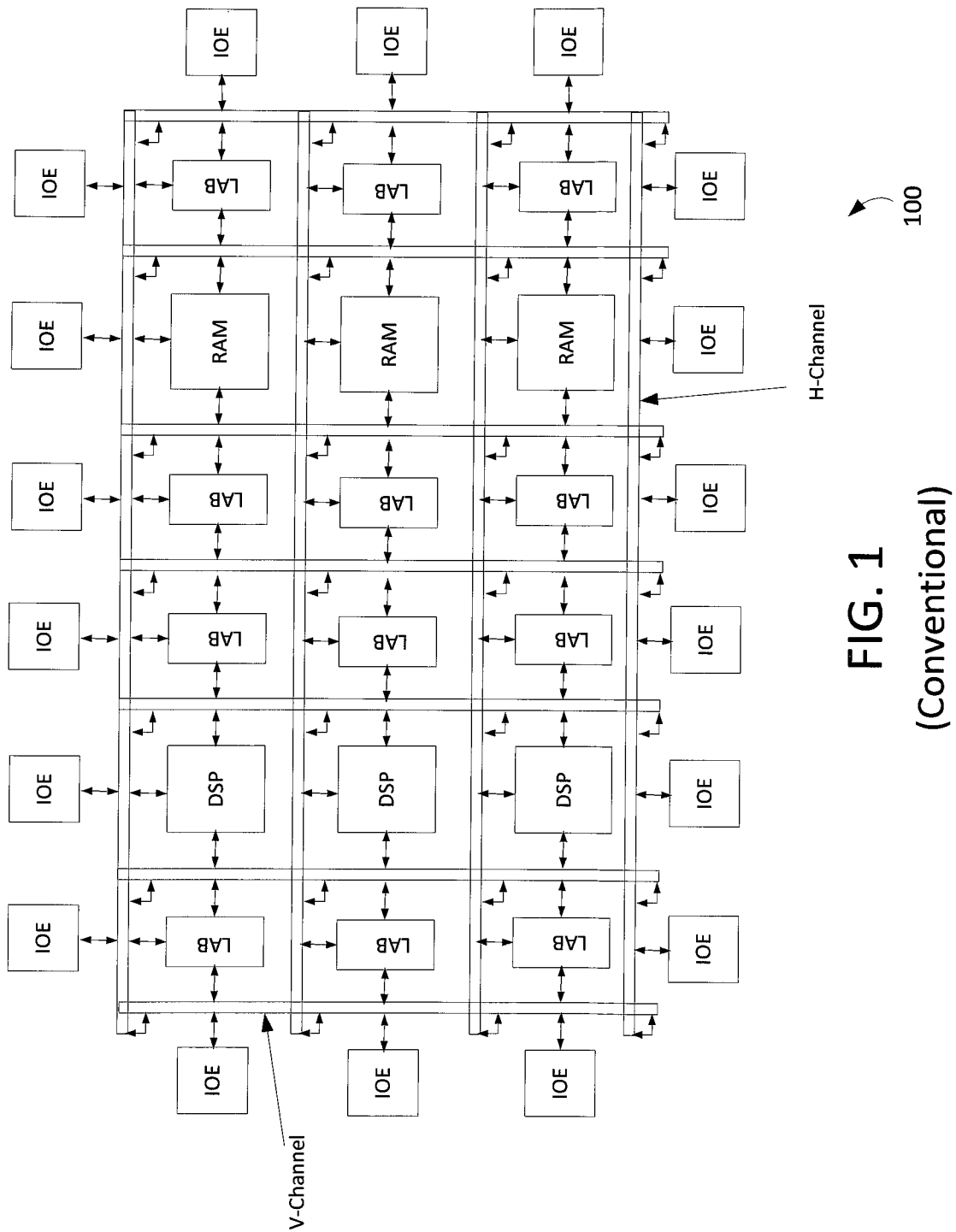
FIG. 1
(Conventional)

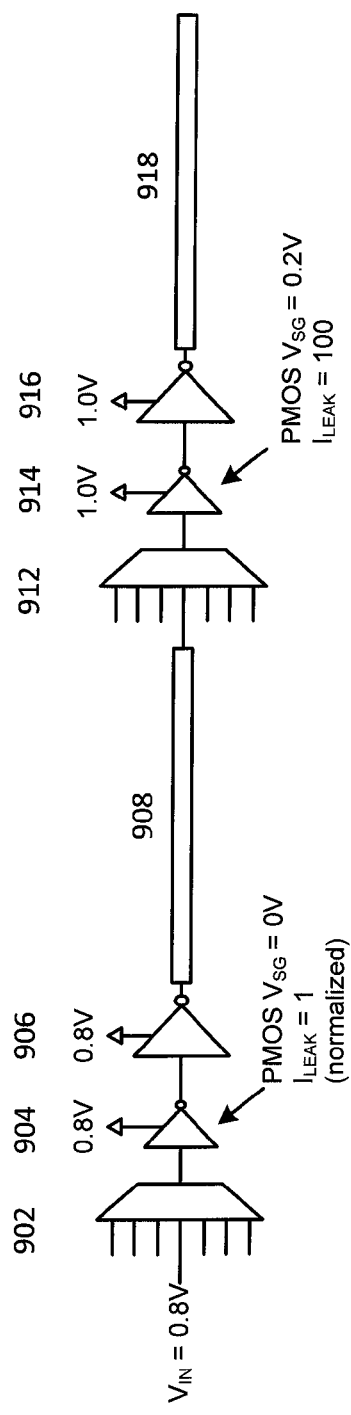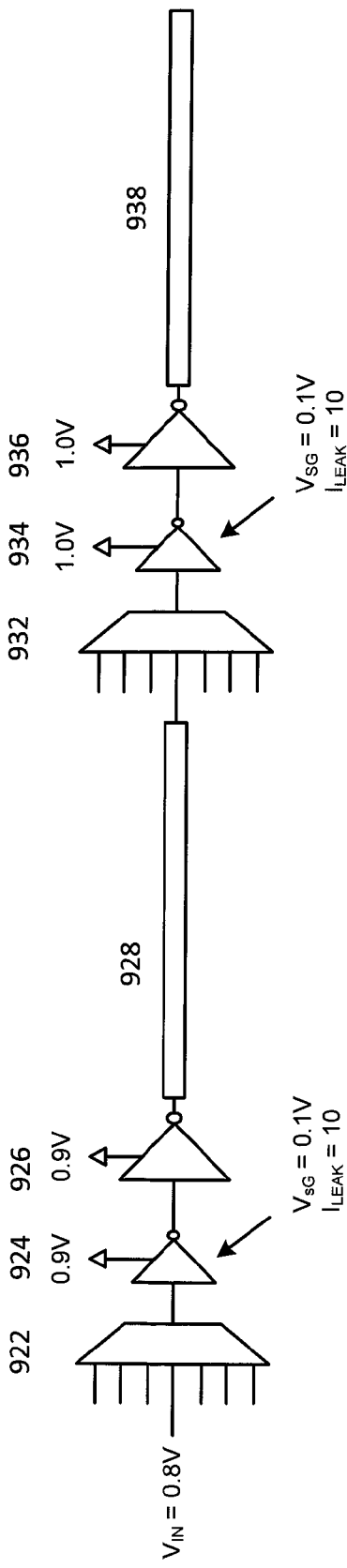
FIG. 9A
FIG. 9B

MULTIPLE-VOLTAGE PROGRAMMABLE LOGIC FABRIC

BACKGROUND

1. Technical Field

The present disclosure relates generally to integrated circuits and, in particular, to improved architectures for a programmable logic device.

2. Description of the Background Art

A programmable logic device ("PLD") is a digital, user-configurable integrated circuit used to implement a custom logic function. PLDs have found particularly wide application as a result of their combined low up front cost and versatility to the user. For the purposes of this description, the term PLD encompasses any digital logic circuit configured by the end-user, and includes a programmable logic array ("PLA"), a field programmable gate array ("FPGA"), and an erasable and complex PLD.

The basic building block of a PLD is a logic element that is capable of performing logic functions on a number of input variables. The logic elements of a PLD may be arranged in groups of, for example, eight to form a larger logic array block ("LAB").

Multiple LABs (and other functional blocks, such as memory blocks, digital signal processing blocks, and so on) are generally arranged in a two-dimensional array in a PLD core. The blocks may be separated by horizontal and vertical interconnect channels so as to form a two-dimensional array. Inputs and outputs of the LABs may be programmably connectable to horizontal and vertical interconnect channels.

A variety of PLD architectural approaches to arranging the interconnect array and logic elements have been developed. These approaches typically aim to optimize logic density and/or signal routability between the various logic elements.

SUMMARY

One embodiment relates to an integrated circuit including a multiple-voltage programmable logic fabric. The programmable logic fabric includes circuits of a first type operating in a first voltage domain and circuits of a second type operating in a second voltage domain. The second voltage domain has a lower supply voltage than the first voltage domain. The integrated circuit further includes downward level conversion circuit elements in the programmable logic fabric for driving signals from the first voltage domain to the second voltage domain and upward level conversion circuit elements in the programmable logic fabric for driving signals from the second voltage domain to the first voltage domain.

Another embodiment relates to a method of converting a signal from a lower-voltage domain to a higher-voltage domain in a programmable logic device. A data input signal is received, where the data input signal is powered by a lower supply voltage of the lower-voltage domain. A clock pulse signal may be generated, where the clock pulse signal provides a periodic pulse having a pulse width. During the pulse width, the data input signal is driven onto an internal node using a higher supply voltage of the higher-voltage domain, and the data output signal is driven from the internal node.

Another embodiment relates to a multiple-voltage programmable logic fabric. The programmable logic fabric includes logic blocks operating in a first voltage domain and interconnect circuits operating in a second voltage domain. The second voltage domain has a lower supply voltage than the first voltage domain. The programmable logic fabric further includes downward level conversion circuit elements for driving signals from the first voltage domain to the second voltage domain and upward level conversion circuit elements for driving signals from the second voltage domain to the first voltage domain.

Other embodiments, aspects, and features are also disclosed.

BRIEF DESCRIPTION OF THE DRAWINGS

FIG. 1 is an overview of an exemplary routing topology for a field programmable gate array (FPGA).

FIG. 9A depicts single-stage level-conversion circuitry in accordance with an embodiment of the invention.

FIG. 9B depicts two-stage level-conversion circuitry in accordance with another embodiment of the invention.

DETAILED DESCRIPTION

Example Routing Topology

Figure 2:
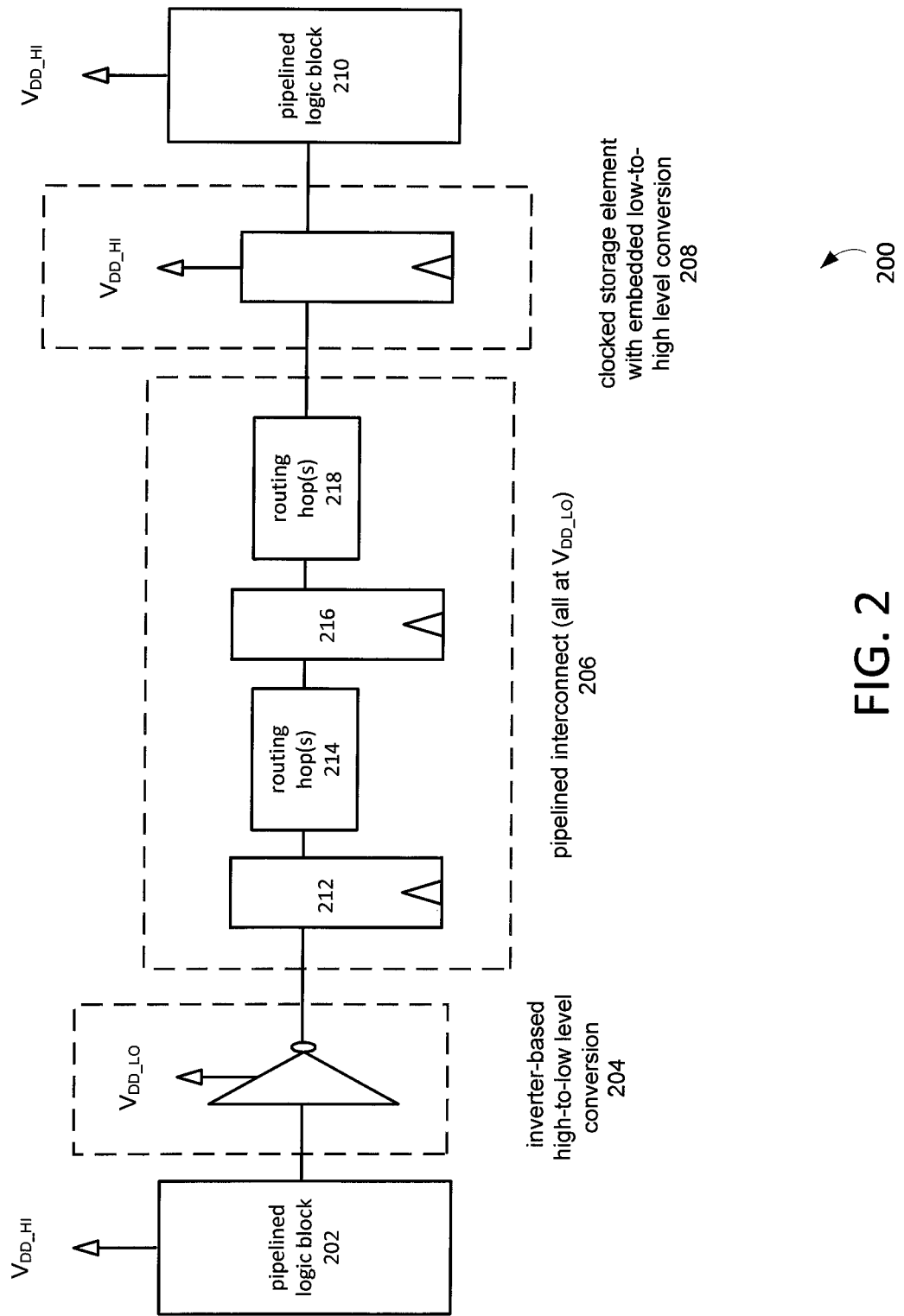
FIG. 2 depicts exemplary multiple-voltage pipelined circuitry with embedded level converters for an FPGA fabric in accordance with an embodiment of the invention.

FIG. 1 is an overview of an exemplary routing topology 100 for an FPGA. An embodiment of the present invention may be implemented within such a routing topology. Note that other routing wire topologies, besides the topology 100 depicted in FIG. 1, are intended to be included within the scope of the present invention. For example, the routing wire topology may include wires that do not exist completely within a single routing channel, such as wires that travel diagonally or that travel horizontally and vertically along different parts of their extent. Furthermore, it should be understood that embodiments of the present invention are not limited to being implemented in an FPGA and may be implemented in other integrated circuits with a programmable logic fabric.

As shown, the FPGA includes a two-dimensional array of functional blocks, including logic array blocks (LABs) and other functional blocks, such as random access memory (RAM) blocks and digital signal processing (DSP) blocks, for example. The FPGA also includes programmable interconnect in the form of horizontal and vertical channels, each channel including one or more routing wires. In addition, input/output elements (IOEs) may be located around the periphery of the chip.

Different routing architectures may have LABs which connect to different numbers of routing channels. A three-sided routing architecture is depicted in FIG. 1 due to there being bi-directional connections on three sides of each functional unit to the routing channels. Other routing architectures are also intended to be included within the scope of the present invention. Examples of other routing architectures include 1-sided, 1½-sided, 2-sided, and 4-sided routing architectures.

Power Reduction and Performance Trade-Off

It has become increasingly desirable to reduce the power consumption of integrated circuits, including FPGAs and other programmable logic devices. Reducing power consumption advantageously conserves energy and reduces cooling requirements for the integrated circuits.

The supply voltage is one parameter that significantly affects power consumption. Reducing the supply voltage generally lowers power consumption. However, reducing the supply voltage also lowers performance of the integrated circuit. Hence, the simple reduction of the supply voltage results in a substantial performance penalty.

Multiple-Voltage Programmable Interconnect

The present application discloses a technique that advantageously utilizes lower supply voltages to substantially reduce power consumption, while mitigating the performance penalty incurred. This is accomplished using a multiple-voltage programmable interconnect within an integrated circuit, such as an FPGA or other programmable logic device.

In one embodiment, a highly-pipelined programmable logic fabric uses multiple supply voltages. Conversion between the supply voltage levels may be embedded in pipelined storage elements, such as clocked storage elements at the boundary between low and high voltage circuitry, for example.

The programmable logic fabric may be partitioned into multiple voltage domains based on the power and delay characteristics of the underlying resources. For example, one type of underlying resource may be logic blocks, and another type of underlying resource may be routing elements. Hence, in one implementation, the programmable logic fabric may be partitioned into a first voltage domain using a higher supply voltage for the logic blocks and a second voltage domain using a lower supply voltage for the routing elements. This architecture advantageously enables the realization of power-delay improvements from a multiple-voltage approach without being dependent on knowledge beforehand of the underlying user design.

FIG. 2 depicts exemplary multiple-voltage pipelined circuitry with embedded level converters for an FPGA fabric in accordance with an embodiment of the invention. The exemplary multiple-voltage circuitry 200 shown in FIG. 2 provides two voltage domains—a higher voltage for logic blocks and a lower voltage for routing elements. In one implementation, the higher voltage may be 1.0 volts, while the lower voltage may be 0.8 volts. Of course, the specific voltages used will vary depending on the implementation.

As depicted, the exemplary multiple-voltage circuitry 200 includes a first pipelined logic block 202, a high-to-low (downward) level conversion circuit 204, pipelined interconnect 206, a clocked storage element with embedded low-to-high (upward) level conversion 208, and a second pipelined logic block 210. In the example depicted, the pipelined interconnect 206 includes first clocked storage element 212 before first routing hop(s) 214 and second clocked storage element 216 before second routing hop(s) 218.

In this embodiment, the pipelined logic blocks (202 and 210) operate in a high supply voltage domain, and the pipelined interconnect 206 operates in a low supply voltage domain. A high-supply-voltage-level signal output from the first pipelined logic block 202 is converted by the high-to-low level conversion circuit 204 to a low-supply-voltage-level signal. That low-supply-voltage-level signal is provided from the high-to-low level conversion circuit 204 to the pipelined interconnect 206. A low-supply-voltage-level signal output from the pipelined interconnect 206 is converted by the clocked storage element 208 to a high-supply-voltage-level signal. That high-supply-voltage-level signal is provided from the clocked storage element 208 to the second pipelined logic block 210.

Note that a highly-pipelined interconnect fabric may have a large number of connections between voltage domains. Performance-critical signals in a user design may cross voltage domain boundaries frequently. As a result, it is highly desirable to minimize the area, delay and power cost of the level conversion embedded in the clocked storage elements 208. Exemplary circuits for the clocked storage elements 208 are described below in relation to FIGS. 3, 5 and 6 in accordance with embodiments of the present invention.

Figure 3:
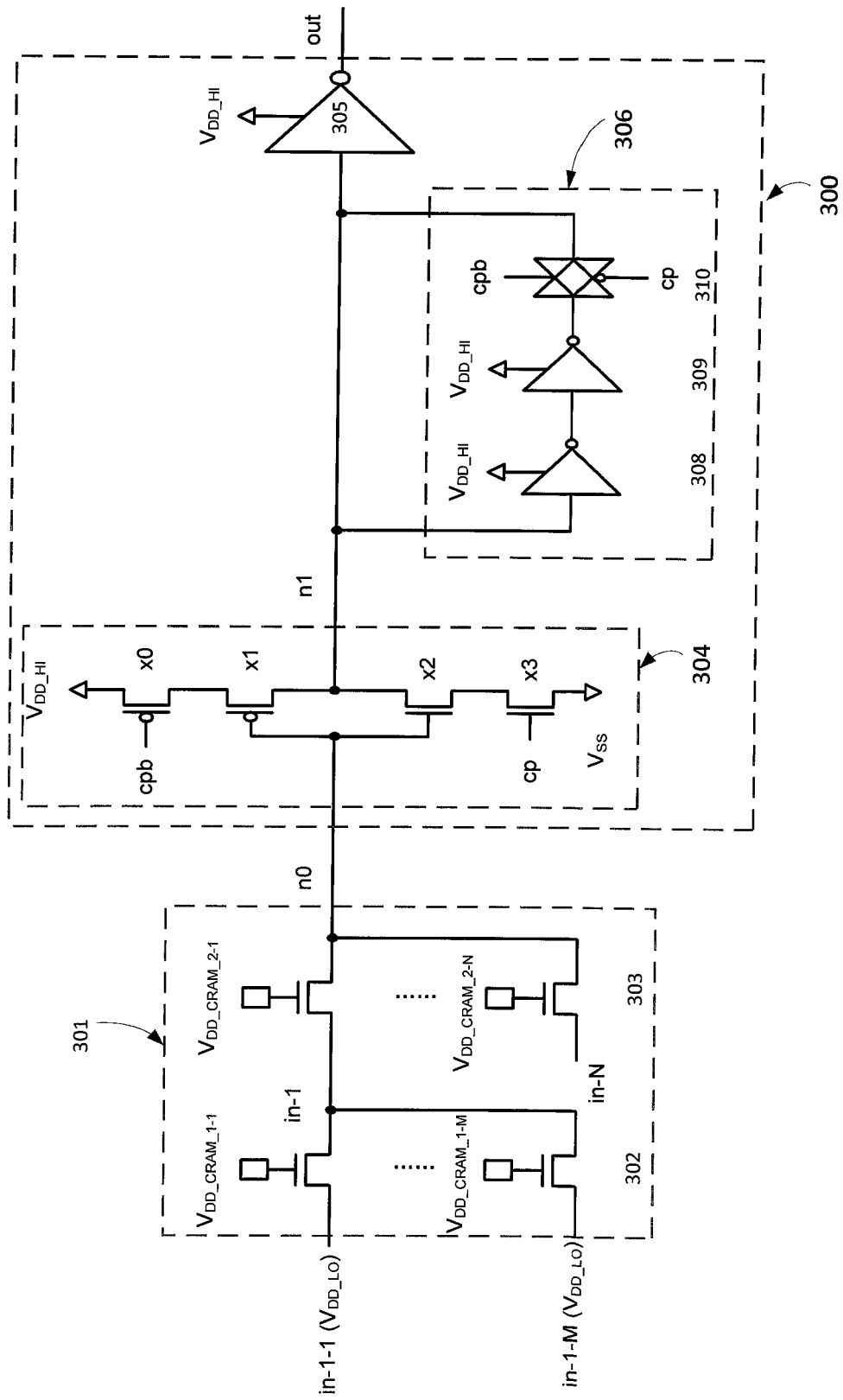
FIG. 3 depicts an exemplary pulse-latch circuit 300 with low-to-high voltage conversion embedded therein in accordance with an embodiment of the invention.

FIG. 3 depicts an exemplary pulse-latch circuit 300 with low-to-high voltage conversion embedded therein in accordance with an embodiment of the invention. As disclosed herein, the pulse-latch circuit 300 is one embodiment of a clocked storage element with embedded low-to-high voltage conversion and may be used, for example, as element 208 in FIG. 2, or as elements 720 and 726 in FIG. 7. Also shown in FIG. 3 is an exemplary routing multiplexer 301.

The routing multiplexer 301 depicted is a two-stage multiplexer structure. The first stage 302 may include a plurality of N first-stage multiplexers, each first-stage multiplexer receiving multiple input signals and selecting one of the multiple input signals. The multiple input signals received by each first-stage multiplexer are all driven by the low-level supply voltage ($V_{DD\_LO}$). The second stage 304 may include a single multiplexer receiving N selected input signals from the N first-stage multiplexers and selecting one of the N input signals.

Note that only a first of N multiplexers in the first stage 302 is depicted in FIG. 3. The depicted first-stage multiplexer receives M input signals (labeled in-1-1 through in-1-M) which are driven by a low supply voltage and selects one of the M input signals based on the states of M configuration bits (labeled $V_{DD\_CRAM\_1-1}$ through $V_{DD\_CRAM\_1-M}$), the selected input signal being labeled in-1. Similarly, the other N-1 first-stage multiplexers (not depicted) select N-1 input signals. The resulting N selected input signals provided by the N first-stage multiplexers are labeled in-1 through in-N.

These N input signals selected by the first stage 302 are input into the second stage 303. As shown, the second stage 303 has a single multiplexer that selects one of the N input signals based on the states of N configuration bits (labeled $V_{DD\_CRAM\_2-1}$ through $V_{DD\_CRAM\_2-N}$), the selected input signal being driven onto node n0 which is the input node for the pulse-latch circuit 300.

The pulse-latch circuit 300 includes a tri-state buffer 304, an inverter 305 and a gated buffer 306. The selected input signal on node n0 is provided to the data input of the tri-state buffer 304.

As shown, the tri-state buffer 304 of the pulse-latch circuit 300 includes a CMOS circuit that includes two PMOS transistors (x0 and x1) and two NMOS transistors (x2 and x3).

PMOS transistor x0 has its source connected to the high-level supply voltage $V_{DD\_HI}$, while NMOS transistor x3 has its source connected to ground. The drain of PMOS transistor x0 is connected to the source of PMOS transistor x1, and the drain of NMOS transistor x3 is connected to the source of NMOS transistor x2. The gates of PMOS transistor x1 and NMOS transistor x2 are connected together at node n0 which is the input node of the tri-state buffer. The drains of PMOS transistor x1 and NMOS transistor x2 are connected together at node n1 which is the output node of the tri-state buffer 304.

Note that the negative supply voltage $V_{SS}$ is generally referred to as ground in the present disclosure. It is intended that a common ground (i.e. Vss) be used across all voltage domains described in the present disclosure.

During the pulse of clock pulse signal cp, the tri-state buffer 304 functions to drive an inverse of the selected input signal on node n0 onto its output node n1. Node n1 is connected to the input of inverter 305 which is powered by the high-level supply voltage $V_{DD\_HI}$, and the output signal out of inverter 305 drives the output of the pulse-latch circuit 300. Hence, during the pulse of clock pulse signal cp, the pulse-latch circuit 300 drives the output signal out based on the selected input signal provided by the routing multiplexer 301.

The gated buffer circuit 306 of the pulse-latch circuit 300 is connected in parallel between the output of the tri-state buffer 304 and the inverter 305. The gated buffer circuit 306 includes, in series, a first inverter 308, a second inverter 309, and a transmission gate 310, each being powered by the high-level supply voltage $V_{DD\_HI}$. The input of the first inverter 308 and the output of the transmission gate 310 are connected to the node n1. The transmission gate 310 is controlled by the cpb signal, which is the inverse of the cp signal, such that the transmission gate 310 drives node n1 when cpb is high (i.e. not during the pulse).

In accordance with an embodiment of the invention, leakage by PMOS transistor x0 may be effectively stopped or minimized when the clock pulse signal cp is low (i.e. when cpb is high). This may be accomplished by using the high-level supply voltage such that cpb is at the voltage level $V_{DD\_HI}$ when cpb is high such that the source-gate voltage $V_{SG}=0$ volts for PMOS transistor x0. In contrast, a conventional CMOS inverter-based low-to-high level conversion circuit has a static (constant) high leakage due to the source-gate voltage for its PMOS transistor being positive (for example, $V_{SG}=+0.2$ volts).

Regarding PMOS transistor x1, when the clock pulse signal cp is low, then leakage from PMOS transistor x1 is effectively blocked by the non-leakage state of PMOS transistor x0, as discussed above. Only when the clock pulse signal cp and the latch input (i.e. node n0) are both high, then there is some leakage from PMOS transistor x1. This is due to the source-gate voltage for PMOS transistor x1 being positive (for example, $V_{SG}=+0.2$ volts) due to the source being at $V_{DD\_HI}$ while gate (i.e. node n0) is at $V_{DD\_LO}$. To minimize this static power overhead, an incoming clock signal clk may be converted to the clock pulse signal cp with a short duty cycle, where the pulse width is narrow but remains sufficiently wide for the latch to reliably capture new data.

Advantageously, while the input buffer stage of the pulse-latch circuit 300 may experience leakage, the duration of this leakage state is limited to the width of the pulse. In accordance with an embodiment of the invention, the programmable pulse generator that is used with the pulse-latch circuit 300 may be designed or configured to produce a minimum width pulse for reduced power cost. In such cases, it may be desirable to use pulse-latch circuits 300 that support a programmable pulse-width so as to allow time borrowing across critical latches to improve overall performance. Computer-aided design (CAD) tools may be used to select the power-delay optimal pulse-width setting for each latch instance in a user's design based on the specific performance requirements of the path and power requirements of the design.

Figure 4A:
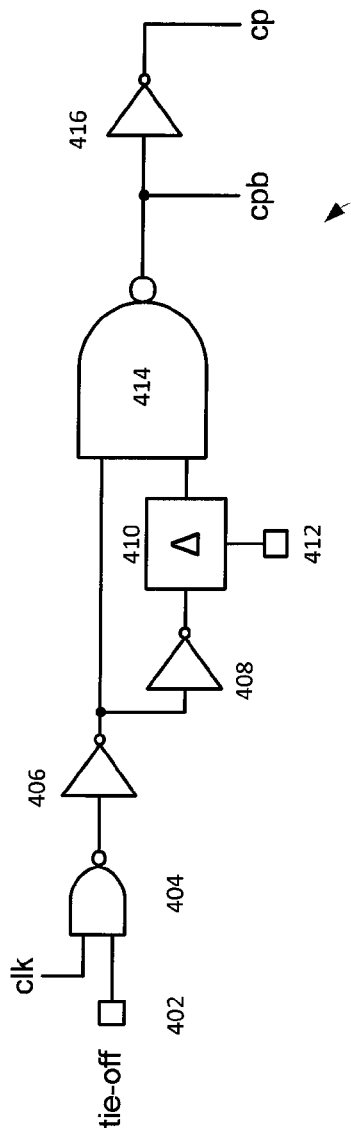
FIG. 4A depicts an exemplary clock pulse generator circuit in accordance with an embodiment of the invention.
Figure 4B:
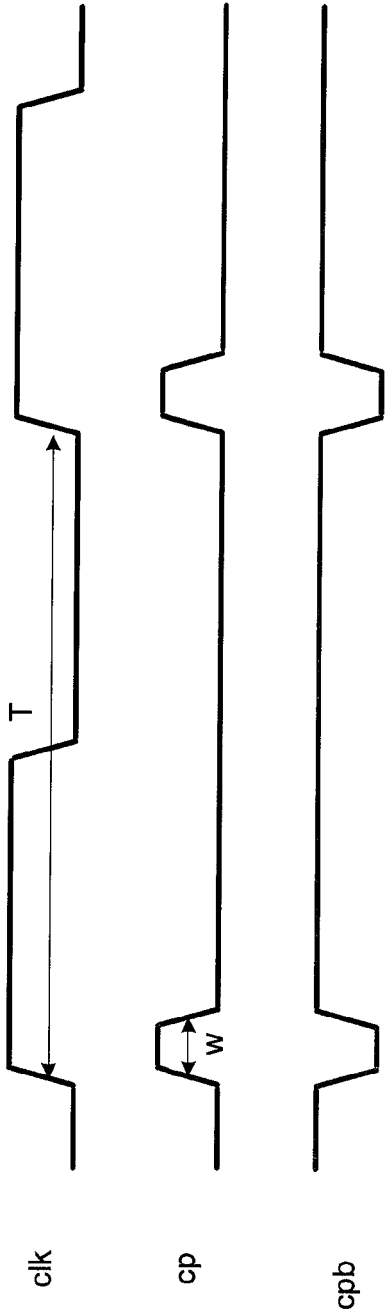
FIG. 4B is a timing diagram for the clock pulse generator circuit of FIG. 4A in accordance with an embodiment of the invention.

FIG. 4A depicts an exemplary clock pulse generator circuit 400 in accordance with an embodiment of the invention. An exemplary timing diagram for the clock pulse generator circuit 400 is shown in FIG. 4B. The clock pulse generator circuit 400 may supply the clock pulse signals (cp and cpb) to the embedded level-conversion circuitry disclosed herein.

Figure 5:
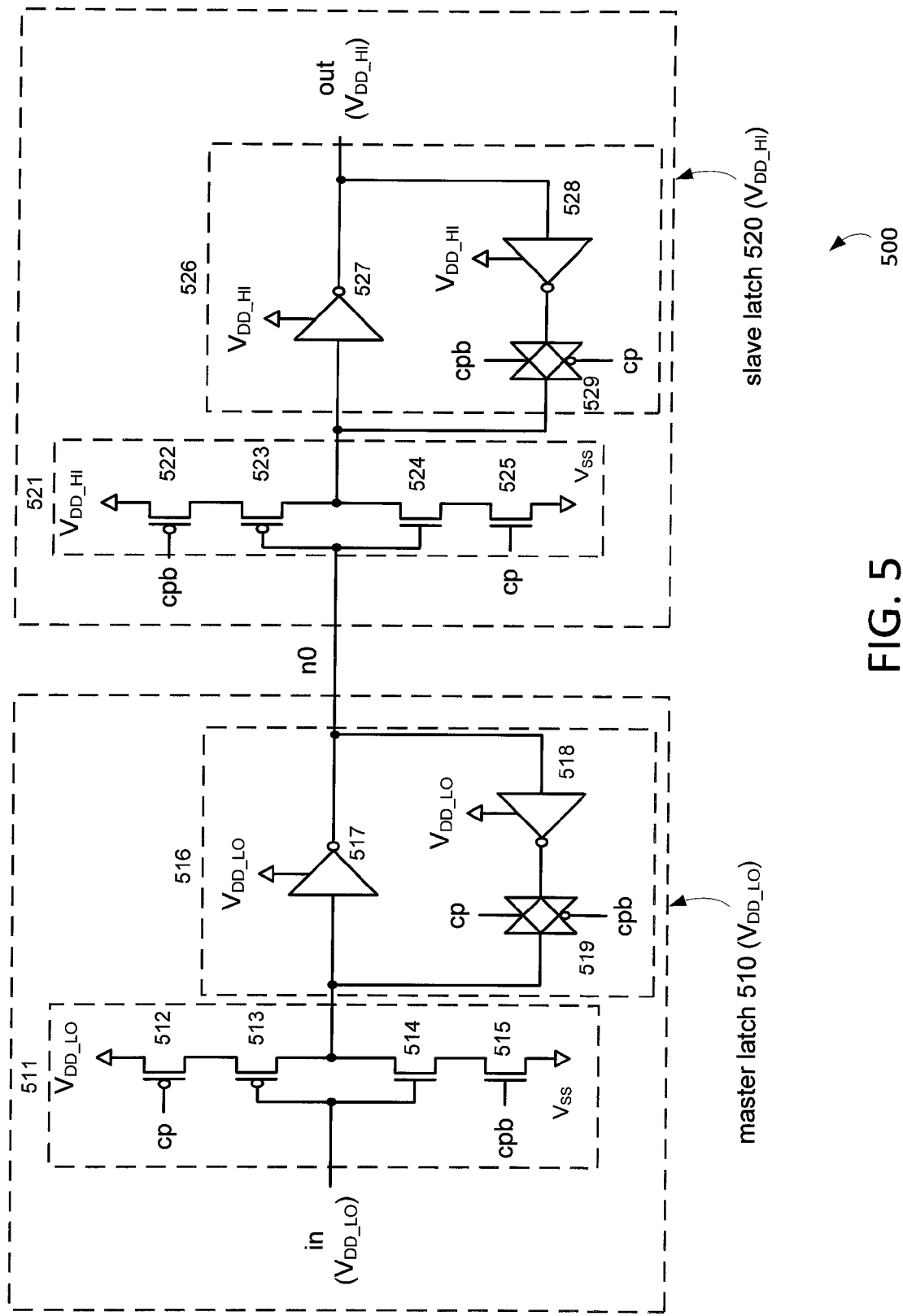
FIG. 5 depicts an exemplary edge-triggered flip-flop (FF) circuit with low-to-high voltage conversion embedded therein in accordance with an embodiment of the invention.
Figure 6:
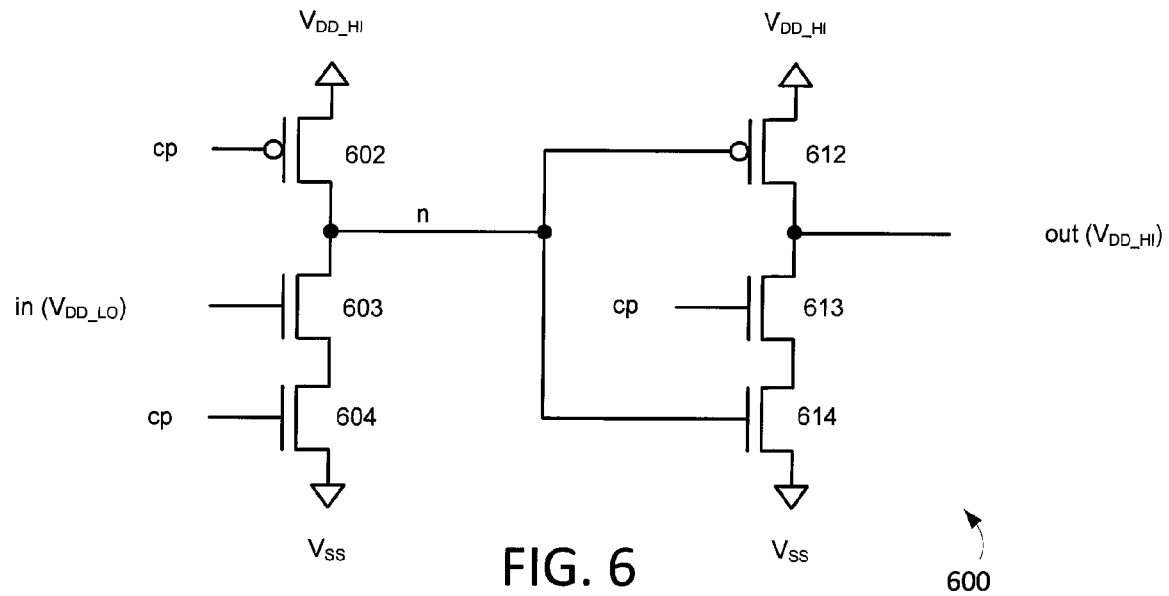
FIG. 6 depicts an exemplary dynamic latch circuit with low-to-high voltage conversion embedded therein in accordance with an embodiment of the invention.

The clock pulse signals (cp and cpb) may be supplied, for example, to the pulse-latch circuit 300 of FIG. 3, the edge-triggered FF circuit 500 of FIG. 5, or the dynamic latch circuit 600 of FIG. 6. The clock pulse generator circuit 400 may be dedicated for use by the embedded level-conversion circuitry or may be shared with other circuitry on the integrated circuit.

In the depicted embodiment, the clock pulse generator circuit 400 may include two NAND gates (404 and 414), three inverters (406, 408 and 416), and a delay element 410. The first NAND gate 404 receives an input clock signal clk and also receives an input from a configurable tie-off bit. When the tie-off bit is configured to be low, then the output of the first NAND gate 404 is forced to be high, resulting in the cp signal being forced to be low. When the tie-off bit is configured to be high, then the output of the first NAND gate 404 is driven to be the inverse of the input clock signal clk, resulting in the cp signal being a clock-pulse signal as described below. As depicted in FIG. 4B, the input clock signal clk may have a period T.

The first inverter 406 inverts the output from the first NAND gate 404. The output of the first inverter 406 is provided by two paths to the two inputs of the second NAND gate 414: on a first path directly to a first input of the second NAND gate 414; and on a second path though the second inverter 408 and the delay element 410, in series, to the second input of the second NAND gate 414. As a result, the second NAND gate 414 outputs an inverse clock pulse signal cpb which has a pulse width w that depends on the delay of the second path in relation to the first path. The third inverter 416 generates the clock pulse signal cp from cpb.

The delay element 410 may be fixed or may be configurable, depending on the implementation. If the delay element 410 is configurable, its width w may be controlled by programmable bits 412. Advantageously, such a programmable delay element 410 enables the pulse width to be tuned to the requirements of the storage element or to support programmable widths for post-silicon tradeoffs.

FIG. 5 depicts an exemplary edge-triggered FF circuit 500 with low-to-high voltage conversion embedded therein in accordance with an embodiment of the invention. As disclosed herein, the edge-triggered FF circuit 500 is one embodiment of a clocked storage element with embedded low-to-high voltage conversion and may be used, for example, as element 208 in FIG. 2, or as elements 720 and 726 in FIG. 7. A routing multiplexer (such as routing multiplexer 301 in FIG. 3) may be used to select the data input signal in for the edge-triggered FF circuit 500. A clock pulse generator (such as clock pulse generator circuit 400 in FIG. 4A) may be used to provide the clock signal cp and its inverse cpb.

As depicted, the edge-triggered FF circuit 500 includes a master latch 510 in series with a slave latch 520 with node n0 between them. In other words, a master-slave latch topology may be used to implement the edge-triggered FF circuit 500.

In the implementation shown, the master latch 510 includes a CMOS tri-state buffer 511 in series with a storage unit 516. The CMOS tri-state buffer 511 may be formed using two PMOS transistors (512 and 513) and two NMOS transistors (514 and 515). The storage unit 516 may be formed using two inverters (517 and 518) and a transmission gate 519 in a loop structure.

Similarly, the slave latch 520 includes a CMOS tri-state buffer 521 in series with a storage unit 526. The CMOS tri-state buffer 521 may be formed using two PMOS transistors (522 and 523) and two NMOS transistors (524 and 525). The storage unit 526 may be formed using two inverters (527 and 528) and a transmission gate 529 in a loop structure.

In accordance with an embodiment of the invention, the supply voltage for the data input signal in and the master latch 510 is the low-level supply voltage $V_{DD\_LO}$, and the supply voltage for the slave latch 520 is the high-level supply voltage $V_{DD\_HI}$. This difference in supply voltage levels causes leakage in the input buffer 521 to the slave latch 520.

In accordance with an embodiment of the invention, leakage by PMOS transistor 522 may be effectively stopped or minimized when the clock pulse signal cp is low (i.e. when cpb is high). This may be accomplished by using the high-level supply voltage such that cpb is at voltage level $V_{DD\_HI}$ when cpb is high such that the source-gate voltage $V_{SG}=0$ volts for PMOS transistor 522. In contrast, a conventional CMOS inverter-based low-to-high level conversion circuit has a static (constant) high leakage due to the source-gate voltage for its PMOS transistor being positive (for example, $V_{SG}=+0.2$ volts).

Regarding PMOS transistor 523, when the clock pulse signal cp is low (i.e. when cpb is high), then leakage from PMOS transistor 523 is effectively blocked by the non-leakage state of PMOS transistor 522, as discussed above. Only when the clock pulse signal cp and the latch input (i.e. node n0) are both high, then there is some leakage from PMOS transistor 523. This is due to the source-gate voltage for PMOS transistor 523 being positive (for example, $V_{SG}=+0.2$ volts) due to the source being at $V_{DD\_HI}$ while gate (i.e. node n0) is at $V_{DD\_LO}$. To minimize this static power overhead, an incoming clock signal clk may be converted to the clock pulse signal cp with a short duty cycle, where the pulse width is narrow but remains sufficiently wide for the register to reliably capture new data.

In this case there is no power-delay tradeoff since we cannot apply time-borrowing across an edge-triggered FF 500 (i.e. there is no delay benefit). However, there is still a power benefit to applying the shortest possible pulse that still guarantees correct functionality, so it may be advantageous to provide the edge-triggered FF circuit 500 with a programmable pulse width. For example, if some the edge-triggered FF circuits 500 can operate with a narrower pulse than others (due to manufacturing variations or different operating conditions), these edge-triggered FF circuits 500 may be programmed with a narrower pulse to reduce power consumption.

FIG. 6 depicts an exemplary dynamic latch circuit 600 with low-to-high voltage conversion embedded therein in accordance with an embodiment of the invention. The dynamic latch circuit 600 may be a true single-phase clocked (TSPC) style latch that requires only a single-phase clock signal (i.e. requires only cp without needing cpb). In the specific implementation shown, the dynamic latch circuit 600 includes two PMOS transistors (602 and 612) and four NMOS transistors (603, 604, 613 and 614).

The first PMOS transistor 602 receives the clock pulse signal cp at its gate, has its source connected to the high-level supply voltage and has its drain connected to an internal node n. The gate of a first NMOS transistor 603 receives the data input signal in, which is driven using the low-level supply voltage $V_{DD\_LO}$. The first NMOS transistor 603 has its source connected to the drain of a second NMOS transistor 604 and its drain connected to the internal node n. The second NMOS transistor receives the clock pulse signal cp at its gate and has its source connected to ground and its drain connected to the source of the first NMOS transistor 603.

The second PMOS transistor 612 has its gate connected to the internal node n, its source connected to the high-level supply voltage $V_{DD\_HI}$, and its drain connected to the output node out, which is driven using the high-level supply voltage $V_{DD\_HI}$. The third NMOS transistor 613 receives the clock pulse signal cp at its gate and has its source connected to the drain of a fourth NMOS transistor 614 and its drain connected to the output node out. The fourth NMOS transistor 614 has its gate connected to the internal node n, its source connected to ground, and its drain connected to the source of the third NMOS transistor 613.

In accordance with an embodiment of the invention, leakage by the first PMOS transistor 602 may be effectively stopped or minimized when the clock pulse signal cp is high. This may be accomplished by using the high-level supply voltage such that cp is at voltage level $V_{DD\_HI}$ when cp is high such that the source-gate voltage $V_{SG}=0$ volts for the first PMOS transistor 602.

Furthermore, the internal node n in the dynamic latch circuit 600 is pre-charged to the high-level supply voltage $V_{DD\_HI}$. This effectively stops or minimizes leakage by the second PMOS transistor 612. This is due to the source-gate voltage $V_{SG}$ being near 0 volts for the second PMOS transistor 612.

Note that the internal node n is potentially discharged depending on the data input signal in applied to the gate of the first NMOS transistor 603. However, such data-dependent discharging is advantageously limited because the discharging occurs only when the data input signal in is high during the pulse of the cp signal.

The clocked storage elements described above in relation to FIGS. 3, 5 and 6 implement level conversion efficiently. The clocked storage element utilized in a region of an FPGA or other programmable logic device may depend on considerations such as area, power or delay. For example, a level-converting pulse latch may be used in elements where time-borrowing is likely to improve the performance of typical user designs (such as a latch at the end of a long routing hop where hold margin is large but setup margin may be small). As another example, elements that are more likely to be at the end of very fast paths may use the edge-triggered flip-flop with embedded level conversion to make it easier to meet hold time requirements.

Figure 7:
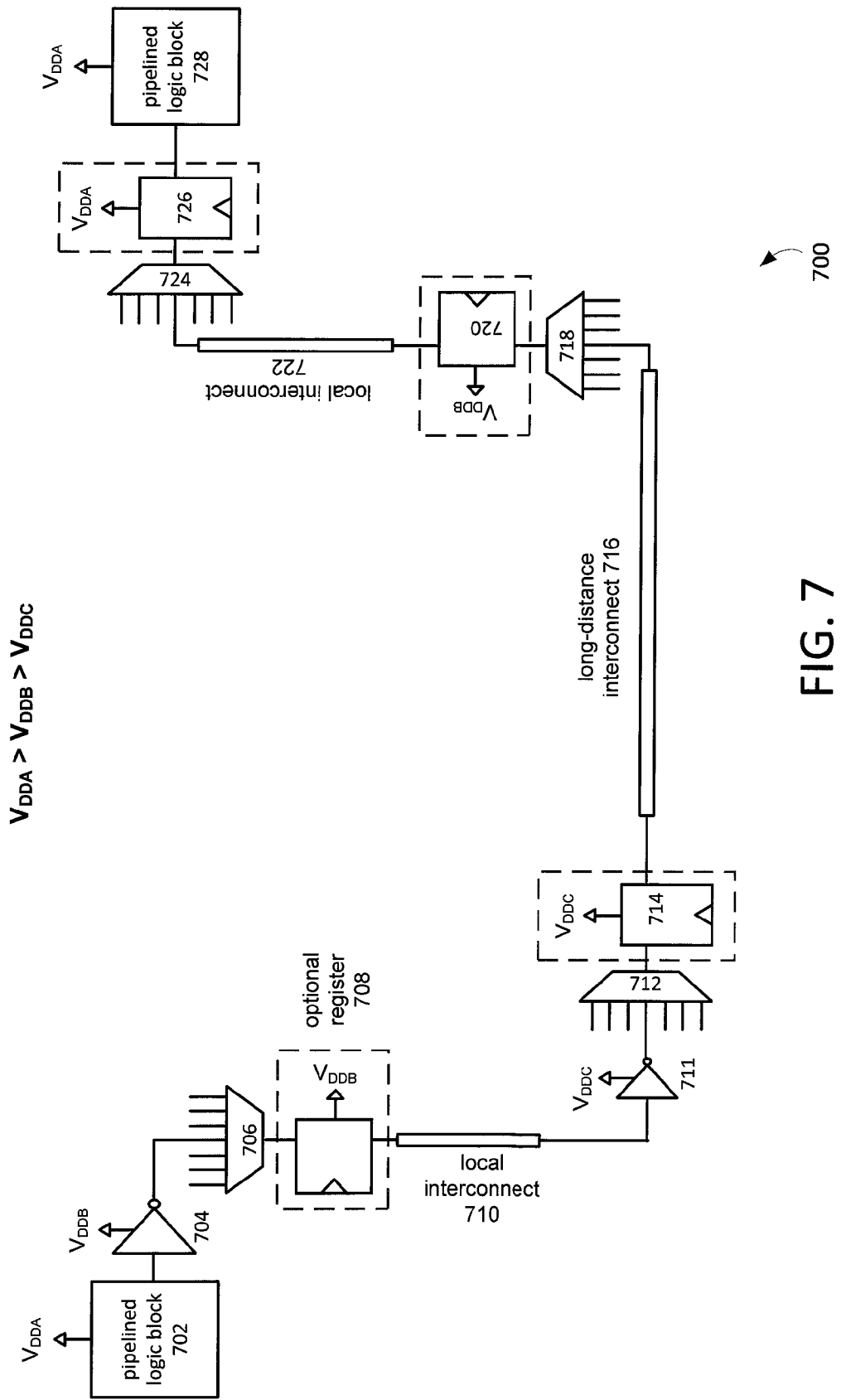
FIG. 7 depicts exemplary multiple-voltage pipelined circuitry with embedded level converters for an FPGA fabric in accordance with another embodiment of the invention.

While FIG. 2 shows pipelined circuitry for a routing fabric with two voltage domains, the present application further discloses pipelined circuitry with more than two voltage domains. FIG. 7 depicts exemplary multiple-voltage pipelined circuitry 700 for a routing fabric with three voltage domains in accordance with another embodiment of the invention. While three voltage domains are shown in the embodiment of FIG. 7, more than three voltage domains may be used in other embodiments.

As shown in FIG. 7, pipelined logic blocks (702 and 728) may be connected to local interconnect resources (710 and 722, respectively), and the local interconnect resources may be connected to long-distance interconnect resources (716). The pipelined logic blocks may be powered using a first supply voltage $V_{DDA}$, the local interconnect may be powered by a second supply voltage $V_{DDB}$, and the long-distance interconnect may be powered by a third supply voltage $V_{DDC}$. In this exemplary implementation, $V_{DDA} > V_{DDB} > V_{DDC}$. In other words, the logic blocks are powered by the upper-level supply voltage, the local interconnect resources are powered by the middle-level supply voltage, and the long-distance interconnect resources are powered by the lower-level supply voltage.

In the particular example depicted, a first pipelined logic block 702 may be connected to first local interconnect 710 by way of a first inverter 704, a first routing multiplexer 706, and a first register 708. The first inverter 704 may convert the signal downward from the first pipelined logic block 702 from the upper-level $V_{DDA}$ domain to the middle-level ($V_{DDB}$) domain. While an example pipelined logic block 702 and corresponding inverter 704 are depicted as feeding into the first routing multiplexer 706, it is to be understood that other resources feed middle-level ($V_{DDB}$) domain signals into the other inputs of the first routing multiplexer 706.

The first routing multiplexer 706 selects one of the data signals and may provide the selected signal to a first register 708. The first register 708 is optional in that the first routing multiplexer 706 may be, in effect, directly connected to the first local interconnect 710 by bypassing the first register 708. Such bypassing of the first register 708 may be accomplished by electronic programming of the integrated circuit.

The first local interconnect 710 may be connected to long-distance interconnect 716 by way of a second inverter 711, a second routing multiplexer 712, and a second register 714. The second inverter 711 may convert the signal downward from the first local interconnect 710 from the middle-level $V_{DDB}$ domain to the lower-level ($V_{DDC}$) domain. While the example register 708 and corresponding local interconnect 710 are depicted as feeding into the second routing multiplexer 712, it is to be understood that other resources feed lower-level ($V_{DDC}$) domain signals into the other inputs of the second routing multiplexer 712.

The second routing multiplexer 712 selects one of the data signals and may provide the selected signal to a second register 714. The second register 714 is optional in that the second routing multiplexer 712 may be directly connected to the long-distance interconnect 716 in an alternate embodiment.

The long-distance interconnect 716 may be connected to a second local interconnect 722 by way of a third routing multiplexer 718 and a third register 720. While the long-distance interconnect 716 is depicted as feeding into the third routing multiplexer 718, it is to be understood that other resources feed lower-level ($V_{DDC}$) domain signals into the other inputs of the third routing multiplexer 718.

The third routing multiplexer 718 selects one of the data signals and may provide the selected signal to the third register 720. In accordance with an embodiment of the invention, the third register 720 may be a clocked storage element with embedded lower-to-middle (upward) level conversion (from $V_{DDC}$ to $V_{DDB}$). In one implementation, the third register 720 may be a pulse-latch circuit, such as, for example, the pulse-latch circuit 300 described above in relation to FIG. 3. Alternatively, the third register 720 may be an edge triggered FF circuit, such as, for example, the edge-triggered FF circuit 500 described above in relation to FIG. 5. As another alternative, the third register 720 may be a dynamic latch, such as, for example, the dynamic latch circuit 600 described above in relation to FIG. 6.

The second local interconnect 722 may be connected to a second pipelined logic block 728 by way of a fourth routing multiplexer 724 and a fourth register 726. While the second local interconnect 722 is depicted as feeding into the fourth routing multiplexer 726, it is to be understood that other resources feed middle-level ($V_{DDB}$) domain signals into the other inputs of the fourth routing multiplexer 724.

The fourth routing multiplexer 724 selects one of the data signals and may provide the selected signal to the fourth register 726. In accordance with an embodiment of the invention, the fourth register 726 may be a clocked storage element with embedded middle-to-upper (upward) level conversion (from $V_{DDB}$ to $V_{DDA}$). In one implementation, the fourth register 726 may be a pulse-latch circuit, such as, for example, the pulse-latch circuit 300 described above in relation to FIG. 3. Alternatively, the fourth register 726 may be an edge triggered FF circuit, such as, for example, the edge-triggered FF circuit 500 described above in relation to FIG. 5. As another alternative, the fourth register 726 may be a dynamic latch, such as, for example, the dynamic latch circuit 600 described in relation to FIG. 6.

In the example structure shown in FIG. 7, the three voltage domains of the routing fabric may organized in a hierarchical network. In the hierarchical network, routing elements may have extensive connectivity within a level (voltage domain) of the hierarchy. However, connections between levels are limited. Such a hierarchical network limits routing flexibility, but it also reduces the number of voltage domain crossings. A reduced number of voltage domain crossings may be advantageous in a routing fabric where not all routing elements have optional storage elements. For example, a routing fabric targeting designs with only moderate pipelining may have routing elements without optional storage elements. In one implementation, potential low-to-high voltage transitions may be limited to routing elements with storage elements to provide power-efficient boundary crossings without excessive area cost due to added registers.

Instead of a hierarchical architecture, an alternate architecture may be used where the routing fabric provides extensive connectivity between all resource types to improve routing flexibility. In this case, low-to-high voltage domain crossings may occur more frequently such that more element types will need level-converting storage elements. If design targets dictate that most routing elements have storage elements (for example, to support a highly-pipelined design), then the area cost of this approach may be small. If there is a power cost associated with voltage domain crossings, then CAD tools may vary the degree of pipelining, the placement of pipeline registers, and the use of multi-voltage routing resources, along with other placement and routing options, to globally optimize power and performance of a given user design.

Figure 8:
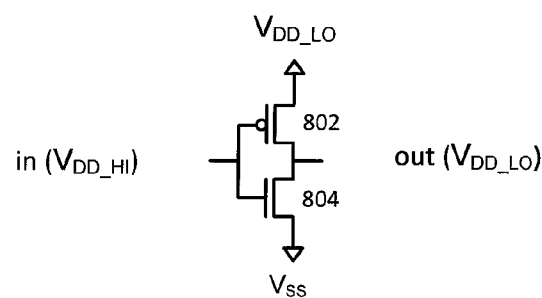
FIG. 8 depicts an inverter circuit for high-to-low voltage conversion in pipelined multiple-voltage circuitry in accordance with an embodiment of the invention.

FIG. 8 depicts an inverter circuit 800 for high-to-low voltage conversion in pipelined multiple-voltage circuitry in accordance with an embodiment of the invention. The inverter circuit 800 may be utilized to implement the inverter 204 of FIG. 2 and the inverters 704 and 711 in FIG. 7. The inverter circuit 800 has low leakage because the source-to-gate voltage $V_{SG}$ is negative. In contrast, when such an inverter circuit is used for low-to-high voltage conversion, substantial leakage occurs due to the source-to-gate voltage $V_{SG}$ being positive.

As depicted, the inverter 800 may include PMOS transistor 802 and NMOS transistor 804, where the gates of both transistors receive an input signal with a high level driven by $V_{DD\_HI}$. The source of the PMOS transistor 802 is connected to $V_{DD\_LO}$, and the source of NMOS transistor 804 is connected to ground ($V_{SS}$).

FIG. 9A depicts single-stage level-conversion circuitry, FIG. 9B depicts two-stage level-conversion circuitry in accordance with an embodiment of the invention. FIG. 9A shows a single-stage level conversion from 0.8 volt to 1.0 volt, while FIG. 9B shows a two-stage level conversion from 0.8 volt to 0.9 volt and from 0.9 volts to 1.0 volts. Normalized leakage currents $I_{LEAK}$ are indicated.

In FIG. 9A, the first routing multiplexer 902 and the first interconnect 908, and the second routing multiplexer 912 all operate in the lower-voltage (0.8 volt) domain, while the second interconnect 918 operates in the higher-voltage (1.0 volt) domain. As indicated, the normalized leakage current will be very small (1 unit, for instance) in the first buffer formed by inverters 904 and 906 which do not change the voltage level, but the normalized leakage current will be much larger (100 units, for instance) in the second buffer formed by inverters 914 and 916 which make a relatively large (0.2 volt) change the voltage level.

In contrast, in FIG. 9B, the first routing multiplexer 922 operates in the lower-voltage domain. However, first interconnect 928 and the second routing multiplexer 932 operate in the middle-voltage (0.9 volt) domain, while the second interconnect 938 operates in the higher-voltage (1.0 volt) domain. As indicated, the normalized leakage current will be moderate (10 units, for instance) in the first buffer formed by inverters 924 and 926 which make a moderate (0.1 volt) change in the voltage level and will also be moderate (10 units, for instance) in the second buffer formed by inverters 934 and 936 which also make a moderate (0.1 volt) change in the voltage level.

Figure 10:
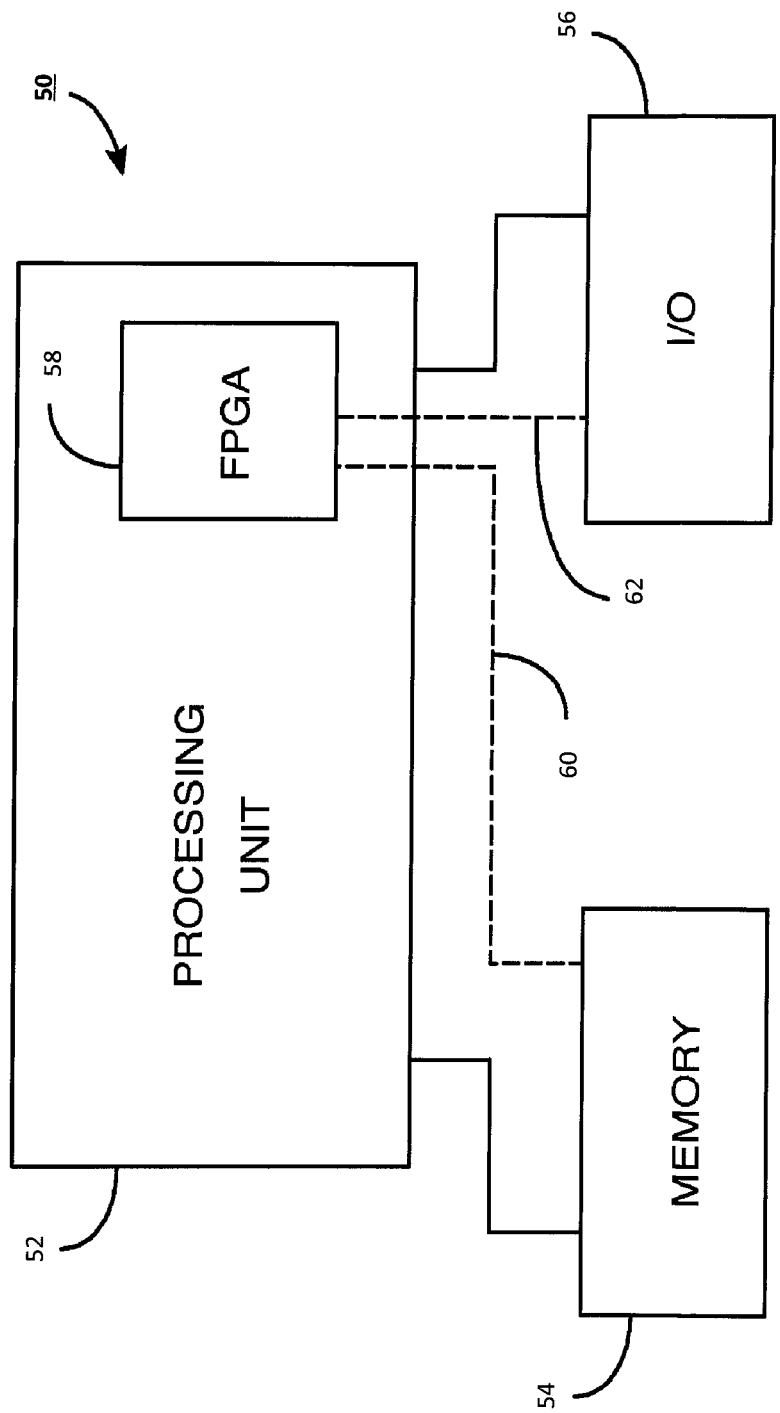
FIG. 10 is a block diagram of an exemplary digital system 50 that may employ circuitry and methods disclosed herein.

FIG. 10 is a block diagram of an exemplary digital system 50 that may employ circuitry and methods disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit comprising:
a multiple-voltage programmable logic fabric including circuits of a first type operating in a first voltage domain and circuits of a second type operating in a second voltage domain, wherein the second voltage domain has a lower supply voltage than the first voltage domain;
downward level conversion circuit elements in the programmable logic fabric for driving signals from the first voltage domain to the second voltage domain; and
upward level conversion circuit elements in the programmable logic fabric for driving signals from the second voltage domain to the first voltage domain,
wherein the upward level conversion circuit elements comprise clocked storage elements with embedded low-to-high level conversion,
wherein the clocked storage elements comprise pulse-latch circuits, and wherein each of the pulse-latch circuits comprises a tri-state buffer connected to an inverter both directly and, in parallel, through a gated buffer circuit, and
wherein the tri-state buffer receives a data signal in the lower voltage domain, and the inverter outputs the data signal in the higher voltage domain.

2. The integrated circuit of claim 1, wherein the first type of circuits comprise pipelined logic blocks, and the second type of circuits comprise pipelined interconnect circuits.

3. The integrated circuit of claim 1, wherein the downward level conversion circuit elements comprise inverters.

4. An integrated circuit comprising:
a multiple-voltage programmable logic fabric including circuits of a first type operating in a first voltage domain and circuits of a second type operating in a second voltage domain, wherein the second voltage domain has a lower supply voltage than the first voltage domain;
downward level conversion circuit elements in the programmable logic fabric for driving signals from the first voltage domain to the second voltage domain; and
upward level conversion circuit elements in the programmable logic fabric for driving signals from the second voltage domain to the first voltage domain,
wherein the upward level conversion circuit elements comprise clocked storage elements with embedded low-to-high level conversion, and
wherein the clocked storage elements comprise edge-triggered flip-flop circuits.

5. The integrated circuit of claim 4, wherein each of the edge-triggered flip-flops comprises a master latch operating in the lower voltage domain and a slave latch operating in the higher voltage domain.

6. An integrated circuit comprising:
a multiple-voltage programmable logic fabric including circuits of a first type operating in a first voltage domain and circuits of a second type operating in a second voltage domain, wherein the second voltage domain has a lower supply voltage than the first voltage domain;

downward level conversion circuit elements in the programmable logic fabric for driving signals from the first voltage domain to the second voltage domain; and upward level conversion circuit elements in the programmable logic fabric for driving signals from the second voltage domain to the first voltage domain, wherein the upward level conversion circuit elements comprise clocked storage elements with embedded low-to-high level conversion, and wherein the clocked storage elements comprise dynamic latches.

7. The integrated circuit of claim 6, wherein each of the dynamic latches comprises
- a first PMOS transistor having a gate receiving a clock pulse signal, a source connected to a supply voltage for the higher voltage domain, and a drain connected to an internal node;
- a first NMOS transistor having a gate receiving a data input signal and a drain connected to the internal node;
- a second NMOS transistor having a gate receiving the clock pulse signal, a source connected to ground, and a drain connected to the source of the first NMOS transistor;
- a second PMOS transistor having a gate connected to the internal node, a source connected to a supply voltage for the higher voltage domain, and a drain connected to an output node;
- a third NMOS transistor having a gate receiving the clock pulse signal and a drain connected to the output node; and
- a fourth NMOS transistor having a gate connected to the internal node, a source connected to the ground, and a drain connected to the source of the third NMOS transistor.

8. An integrated circuit comprising:
a multiple-voltage programmable logic fabric including circuits of a first type operating in a first voltage domain and circuits of a second type operating in a second voltage domain, wherein the second voltage domain has a lower supply voltage than the first voltage domain, and wherein the programmable logic fabric further includes circuits of a third type operating in a third voltage domain, wherein the third voltage domain has a lower supply voltage than the second voltage domain;

downward level conversion circuit elements in the programmable logic fabric driving signals from the first voltage domain to the second voltage domain; and upward level conversion circuit elements in the programmable logic fabric driving signals from the second voltage domain to the first voltage domain;

downward level conversion circuit elements driving signals from the second voltage domain to the third voltage domain; and upward level conversion circuit elements driving signals from the third voltage domain to the second voltage domain.

9. The integrated circuit of claim 8, wherein the second type of circuits comprise local interconnect circuits, and the third type of circuits comprise long-distance interconnect circuits.

10. A method of converting a signal from a lower-voltage domain to a higher-voltage domain in a programmable logic device, the method comprising:
receiving a data input signal powered by a lower supply voltage of the lower-voltage domain;
generating a clock pulse signal from a clock reference signal, the clock pulse signal providing a periodic pulse having a pulse width;
driving the data input signal during the pulse width onto an internal node using a higher supply voltage of the higher-voltage domain; and
driving a data output signal from the internal node.

11. The method of claim 10, wherein the data input signal is driven from the internal node using an inverter powered by the higher supply voltage.

12. The method of claim 10, wherein power leakage is limited to a duration of the pulse width and is blocked outside the duration of the pulse width.

13. The method of claim 10, wherein the method is performed by a clocked storage element.

14. The method of claim 13, wherein the clocked storage element comprises a pulse-latch circuit.

15. The method of claim 13, wherein the clocked storage element comprises an edge-triggered flip-flop circuit.

16. The method of claim 13, wherein the clocked storage element comprises a dynamic latch.

* * * * *